310-800 SR
3/25/86 OR 4,578,613

United States Patent [19]

Posthuma de Boer et al.

[11] Patent Number: 4,578,613

[45] Date of Patent: Mar. 25, 1986

[54] DIAPHRAGM COMPRISING AT LEAST ONE FOIL OF A PIEZOELECTRIC POLYMER MATERIAL

[75] Inventors: Abe Posthuma de Boer; Jan W. Vegt, both of Eindhoven, Netherlands

[73] Assignee: U.S. Philips Corporation, New York, N.Y.

[21] Appl. No.: 114,858

[22] Filed: Jan. 24, 1980

Related U.S. Application Data

[63] Continuation of Ser. No. 888,847, Mar. 22, 1978, abandoned.

[30] Foreign Application Priority Data

Apr. 7, 1977 [NL] Netherlands ........................ 7703836

[51] Int. Cl.⁴ ........................................ H01L 41/08

[52] U.S. Cl. ........................ 310/800; 179/110 A

[58] Field of Search ................ 310/800; 179/110 A

[56] References Cited

U.S. PATENT DOCUMENTS

| | | | |
|---|---|---|---|
| 3,792,204 | 2/1974 | Murayama et al. | 310/800 X |
| 3,816,774 | 6/1974 | Ohnuki et al. | 310/800 X |
| 3,832,580 | 8/1974 | Yamamuro et al. | 310/800 X |
| 3,947,644 | 3/1976 | Uchikawa | 310/800 X |
| 3,973,150 | 8/1976 | Tamura et al. | 179/110 A X |
| 4,008,408 | 2/1977 | Kodama | 310/800 |
| 4,056,742 | 11/1977 | Tibbetts | 310/800 X |
| 4,064,375 | 12/1977 | Russell et al. | 310/800 X |
| 4,127,749 | 11/1978 | Atoji | 310/800 X |
| 4,156,800 | 5/1979 | Sear et al. | 310/800 X |

FOREIGN PATENT DOCUMENTS

| | | | |
|---|---|---|---|
| 2606579 | 9/1976 | Fed. Rep. of Germany | 179/110 A |
| 57435 | 6/1947 | France | 179/110 A |

OTHER PUBLICATIONS

Electroacoustic Transducers W/Piezoelectric High Polymer Films, by Tamura et al, JASA vol. 23, No. 1, Jan./Feb. 1975 pp. 21-26.

*Primary Examiner*—Mark O. Budd

*Attorney, Agent, or Firm*—Robert T. Mayer; Bernard Franzblau

[57] ABSTRACT

An electro-acoustic device comprising at least one diaphragm including a foil of a piezo-electric polymer material. In the rest condition the diaphragm is maintained in a curved position under mechanical prestress freely mounted by means of a curved chassis and/or an elastic support with a non-flat supporting surface. The diaphragm is given such a curved shape associated with the rest condition and is provided with electrodes so that changes in surface shape in accordance with the electrical signals and the attendant non-linear conversion into acoustic signals by portions of the diaphragm is combined with similar surface changes of other portions of the diaphragm. The conversion into acoustic signals by the other portions amplifying those of the first-mentioned portions for the fundamental frequency of the signals, whereas the other portions and the first-mentioned portions compensate one another for the even harmonics of the signal.

The diaphragm may comprise an assembly of two foils of an anisotropic piezo-electric polymer material which are fixed to each other over the entire surface area with their preferred directions extending at an angle relative to each other.

Another preferred construction has a freely mounted diaphragm which consists of at least two oppositely curved parts. The diaphragm is locally provided with electrodes on both sides arranged at the location of maximum curvature of each curved part.

11 Claims, 14 Drawing Figures

DIAPHRAGM COMPRISING AT LEAST ONE FOIL OF A PIEZOELECTRIC POLYMER MATERIAL

This is a continuation, of application Ser. No. 888,847, filed Mar. 22, 1978, now abandoned.

The invention relates to an electro-acoustic device provided with at least one diaphragm comprising at least one foil made of a piezoelectric polymer material, which diaphragm is provided with at least one pair of electrodes that enables electrical signals on said electrodes to be converted into acoustic signals and vice versa. In the rest condition the diaphragm is maintained in a curved position under mechanical prestress freely mounted by means of a curved support and/or by means of an elastic support with a non-flat supporting surface.

A device as described hereinbefore is known from DT-OS 1,902,849, FIG. 22. It may be used as a loudspeaker or as a microphone.

The diagraphm consists of a single foil of a polymer material which under slight mechanical stress engages with a resilient cushion and is secured to a chassis at the edges of this resilient cushion.

As a polymer material polyvinylidene fluoride is particularly suitable since it may acquire piezoelectric properties after it has been subjected to a special treatment. For this purpose, the foil is first monoaxially overstretched, i.e. stretched to such an extent that it is subject to permanent deformation. This means that it is loaded beyond the elastic limit. The foil may then be subjected to a length variation of more than 100%.

This overstretching is generally performed at a temperature which is higher than the glass-rubber transition temperature, but lower than the softening temperature of the polymer material. After this step the foil is exposed to a strong d.c. field for a certain time (generally also at a raised temperature) so that it becomes piezoelectric with a preferred direction in the direction of overstretching.

Such an overstretched foil may also be secured freely in a frame-shaped chassis. The diaphragm then has no further support, apart from the frame. Starting from a curved chassis—i.e. the mounting rim of the chassis is not disposed in one plane—a wide variety of curved diaphragm surfaces can be obtained. Such a diaphragm construction is known from DT-OS 2,508,556.

Such an overstretched foil can be secured in a frame-shaped curved chassis in accordance with the Applicant's previous non-published proposal. The foil is glued in the frame without prestress and uniformly heated to a temperature between 70° and 90° C. As a result of this, the foil shrinks and is tensioned tautly and thus obtains the desired curved surface. In this way it is possible to give the piezoelectric diaphragm a variety of so-called "Soap-film surfaces", such as the shape of a saddle surface.

The invention is based on research conducted on diaphragms which has led to the following conclusion:

When a sinewave voltage is applied to the two electrodes of a curved piezoelectric polymer diaphragm, the piezoelectric effect will give rise to a variation in length (or area) of the diaphragm. Tests conducted on for example PVDF have revealed that this length variation is substantially linear with the applied voltage. However, owing to the geometry of the diaphragm the conversion of this length, in a direction perpendicular to the surface of said diaphragm, appears to be non-linear, the resultant relative deformation being dependent on the geometry of the diaphragm surface and the amplitude of the length variation (or area variation) of the polymer.

As is evident from the foregoing the geometry of the diaphragm is responsible for distortions occurring during conversion of electrical signals into acoustic signals and vice versa.

It is an object of the invention to reduce or eliminate the distortion produced by the geometry of the diaphragm and for this purpose the invention is characterized in that the diaphragm is given such a curved associated with the rest condition and is provided with electrodes in such a way that the changes in surface shape in conformity with the electrical signals and the corresponding nonlinear conversion into acoustic signals of portions of the diaphragm is combined with similar changes in surface shape of other portions of the diaphragm, the conversion into acoustic signals amplifying those of the first mentioned portions for the fundamental wave of the signals, but compensating for those of the first mentioned portions for the even harmonics of the signals.

In accordance with a first embodiment of the invention one of the steps is to compose said diaphragm from an assembly of two foils of an anisotropic piezo-electric polymer material which are attached to each other over the entire surface area, the preferred directions of the foils extending at an angle, for example orthogonally, relative to each other.

The foils are each monoaxially overstretched and are glued or pressed onto each other in such a way that the directions of overstretching—i.e. the preferred directions— are for example perpendicular to each other. The foils in the assembly thus formed are excited in such a way that one foil contracts when the other expands. When moreover the chassis consists of portions with opposite curvatures at the appropriate locations, each foil of the diaphragm contributes to the transverse excursion in the same sense, but with an opposite even harmonic distortion. Thus, a substantial reduction of the distortion of the audio signal is obtained.

In a first variant the assembly is provided with electrodes on both sides, which electrodes are connected to the output of an audio amplifier.

In a second variant a central electrode is arranged between the two superimposed foils. Moreover the assembly is provided with electrodes on both sides with said last-mentioned electrodes electrically interconnected. The central electrode and the last-mentioned electrodes are then connected to an output of an audio amplifier.

In a second embodiment of the invention, which starts from a diaphragm which is piezo-electric in at least two directions (such a diaphragm may for example be obtained by gluing two overstretched polyvinylidene foils onto each other with the directions of overstretching perpendicular to each other) and which consists of at least two oppositely curved portions, each curved portion is provided with electrodes on both sides at the location of maximum curvature.

As the various electrode pairs give rise to electric fields in the piezoelectric foil material, the diaphragm is subject to a total transverse excursion in the same direction as a result of the opposite curvatures. This total transverse excursion is the resultant of all transverse excursions caused by all electrode pairs. Distortion as a result of an arbitrary electrode pair is compensated for by the distortion as a result of another electrode pair which is mounted on a diaphragm portion of opposite curavature.

A variant of this embodiment is characterized in that the chassis comprises a frame having oppositely undulated sides disposed opposite each other, the electrodes being interrupted in accordance with the connecting lines of the identical confronting points of curvature of the curved sides.

In a third embodiment of the invention the diaphragm consist of a plurality of curved adjoining surface portions which each perform a vibration which leads to an amplification of the acoustic signals for the fundamental wave, but to a compensation for the even harmonics.

In accordance with a variant thereof said diaphragm portions are disposed adjacent each other in a direction perpendicular to the surfaces of these portions, and are electrically operated in such a way that alternately two adjoining portions move towards each other and at the same time the two next adjoining portions move away from each other.

The invention will be described in more detail with reference to the drawing.

The drawing comprises the following Figures, in which.

Figure 1:
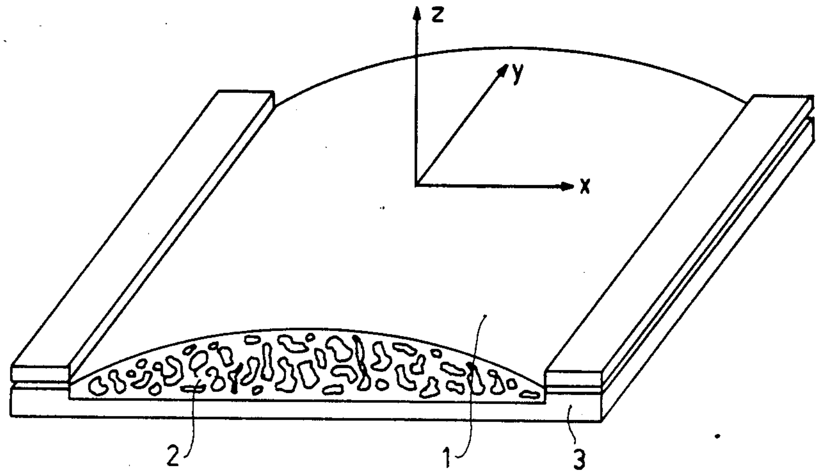
Fig. 1 PRIOR ART
FIG. 1 shows a cylindrical curved piezo-electric diaphragm which is supported in accordance with a known construction.
Figure 2:
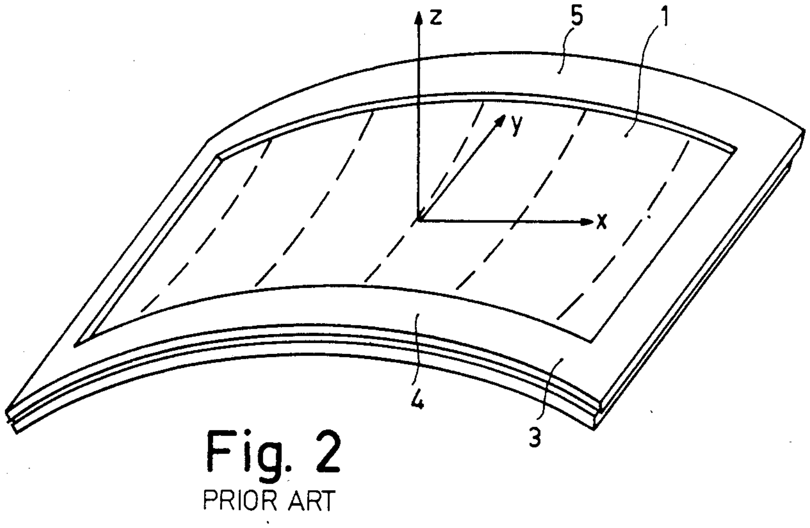
Fig. 2 PRIOR ART
FIG. 2 shows a freely-mounted piezo-electric diaphragm in a curved chassis in accordance with a known construction.
Figure 7B:
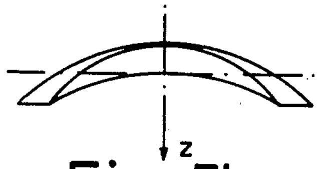
Figure 11:
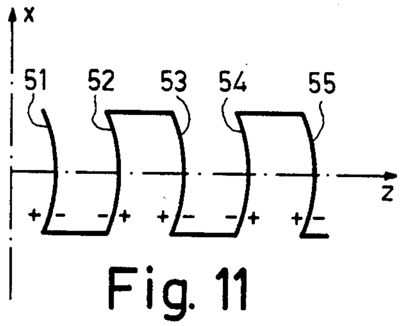
Figure 7A:
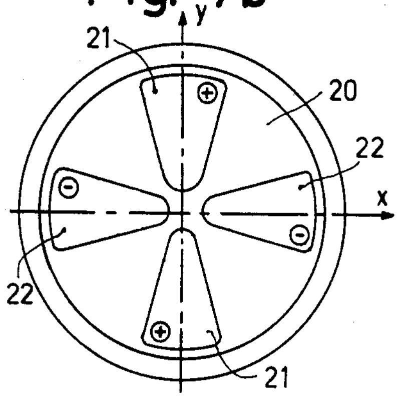
Figure 7C:
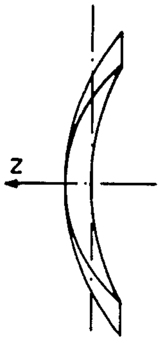
Figure 8B:
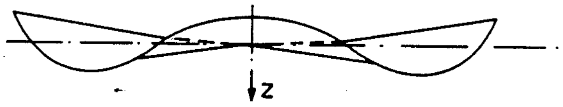
Figure 8A:
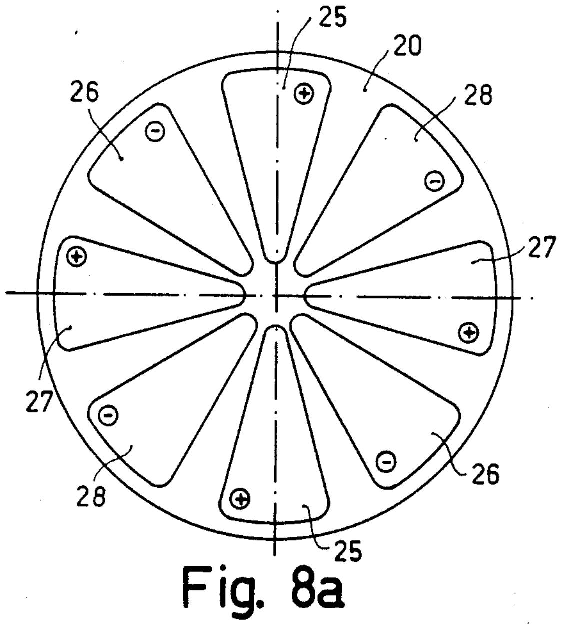
Figure 8C:
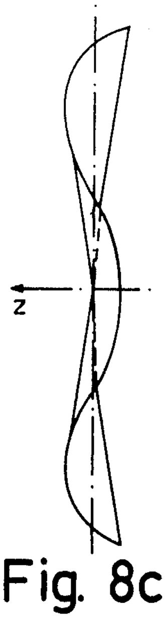
Figure 3A:
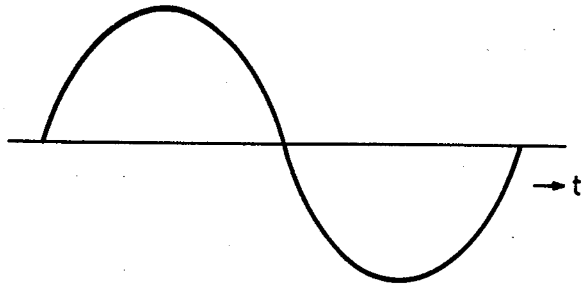
Figure 3B:
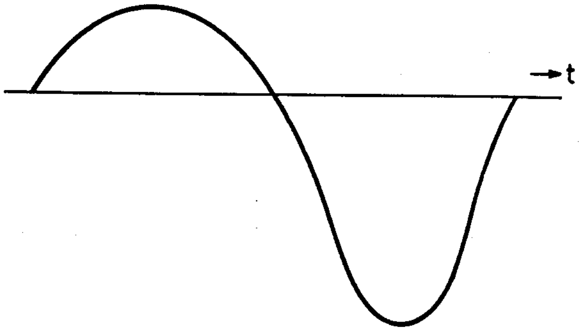
Figure 4:
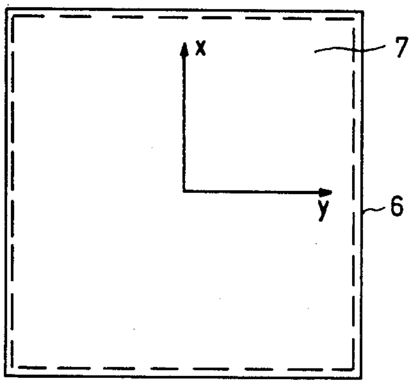
Figure 5:
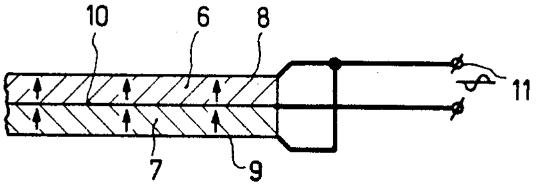
Figure 6:
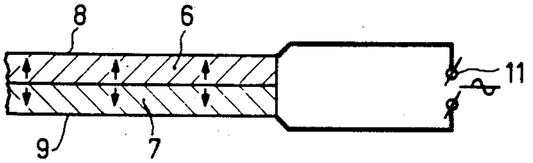
Figure 9B:
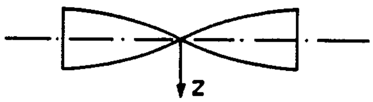
Figure 10:
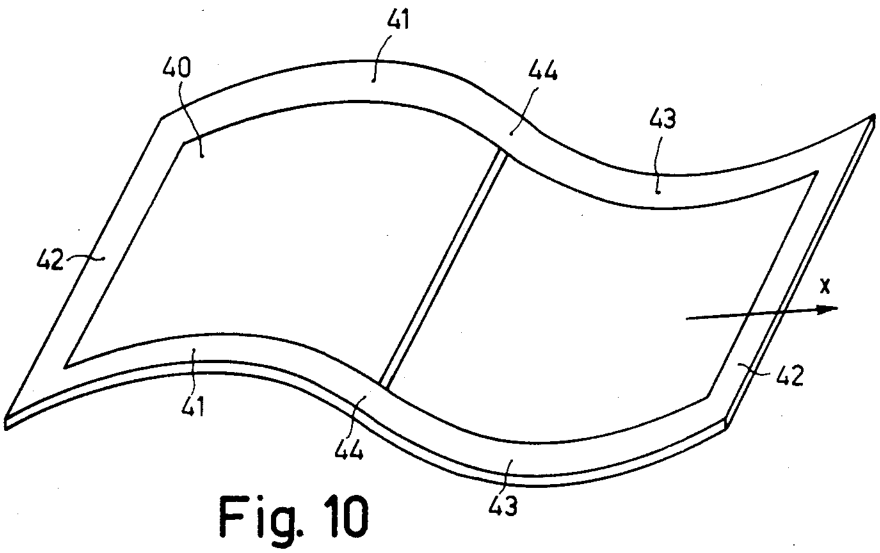

FIGS. 3*a* and 3*b* respectively show the applied sinewave signal and the reproduced signal which has been distorted owing to the curvature of the diaphragms in accordance with FIGS. 1 and 2 respectively;

FIG. 4 schematically shows a diaphragm in accordance with the invention comprising two foils whose preferred directions extend orthogonally;

FIG. 5 shows the diaphragm of FIG. 4 with a central electrode;

FIG. 6 shows the diaphragm of FIG. 5 without a central electrode;

FIG. 7 shows a diaphragm in the rest position in accordance with the invention with two pairs of electrodes in plan and side view;

FIG. 8 corresponds to FIG. 7, but now with 4 electrode pairs, FIG. 8*a* being a plan view and FIGS. 8*b* and 8*c* being side views;

FIG. 9 corresponds to FIG. 8, the electrodes being U-shaped;

FIG. 10 shows a diaphragm in a double oppositely curved frame in accordance with the invention, the diaphragm comprising two adjacent portions;

FIG. 11 corresponds to FIG. 10, said portions being disposed adjacent each other in a direction perpendicular to the surfaces of these portions.

FIG. 1 schematically shows a known loudspeaker, a diaphragm 1 in the form of a foil arranged over a curved supporting body 2 made of a resilient material.

The diaphragm consists of an overstretched foil of a piezo-electric polyvinylidene fluoride material which has been made piezo-electrically anisotropic in a preferred direction. The preferred direction—also the direction of overstretching—of the diaphragm is designated the X-direction in the Figure.

The diaphragm 1 is clamped in a frame 3 and thus is slightly tensioned over the curved surface of the supporting body 2, which body consists of a spongy resilient polyurethane material.

On both sides the diaphragm is provided with electrodes, not shown, which are generally obtained by vacuum deposition of, for example, aluminium. As the thickness of these electrodes may be only 0.001 to 0.1 μm, the electrodes do not affect the movement of the diaphragm.

If an electrical sinewave signal—as is shown in FIG. 3*a*—is applied to the diaphragm, the diaphragm will expand, for example in the X-direction during the positive half-cycle. This results in an excursion in the transverse direction, i.e. the center of the diaphragm moves in the positive Z-direction. During the negative half-cycle of the applied sinewave signal the diaphragm will contract in the X-direction and this performs an axial movement in the negative Z-direction.

Owing to the changing curvature of the foil surface the excursions in the positive and the negative Z-direction differ. The excursion of the diaphragm does not vary in conformity with the applied sinewave signal, but corresponds to the curve in accordance with FIG. 3*b* in which the excursion during the negative half-cycle is greater than that during the positive half-cycle.

If a diaphragm in accordance with FIG. 1 is used in a loudspeaker, i.e. if the electrodes of diaphragm 1 are connected to the output of an audio amplifier, a distorted audio signal will be reproduced. In practice, the second harmonic of this distortion is most annoying.

A similarly distorted signal as reproduced by a diaphragm 1 constructed in accordance with FIG. 2 and operating as a loudspeaker. In this case the diaphragm 1 is mounted in a curved frame 3. Two confronting sides 4 and 5 of this frame are identically curved. As a result of this the diaphragm will have a curved surface. The diaphragm is mounted freely, i.e. 4 is supported by the frame 3 only. For this known diaphragm construction an overstretched foil of polyvinylidene fluoride with a piezoelectric preferred direction in the X-direction is slightly tensioned in the frame—for example by gluing. Owing to a heat treatment performed within a specified temperature range, for example 70°–90° C. for polyvinylidene fluoride, the foil shrinks a few percent and then obtains the desired curvature, the diaphragm then being slightly mechanically tensioned.

FIG. 4 schematically shows a diaphragm in accordance with the invention. This diaphragm comprises two foils of piezoelectric polyvinylidene material. Foil 6 has a piezoelectric preferred direction in the X-direction, whereas foil 7 has a preferred direction in the Y-direction. The two foils, which are identical, are glued or pressed onto each other over the entire surface area. The assembly thus obtained can be provided with electrode in different ways.

In the case of FIG. 5 three electrodes have been provided. Electrodes 8 and 9 are disposed on both sides of this assembly and are electrically interconnected, whereas electrode 10 is disposed between the foils 6 and 7. The electrically connected electrodes 8 and 9 and the electrode 10 are connected to the output terminals 11 of an audio amplifier (not shown). The electrical polarization of the foils 6 and 7 then has the same orientation, as is indicated by the arrows. This polarization can be obtained by applying a strong d.c. field between the electrodes 8 and 9 and at a raised temperature, though preferably between the electrodes 8 and 10 and between the electrodes 9 and 10.

In FIG. 6 only the electrodes 8 and 9 are provided (which in this case are not d.c. coupled) and are connected to output 11 of an audio amplifier, not shown. The directions of polarization of the foils 6 and 7 have now been chosen oppositely.

If a signal is applied to the diaphragm of FIG. 4, foil 7 will expand in its preferred direction, i.e. the Y-direction, when foil 6 shrinks in its preferred direction, i.e. the X-direction.

If the diaphragm is mounted in a curved chassis as shown in FIG. 2 in accordance with the X and Y-directions shown in this FIGURE, the contraction in the X-direction of foil 6 will result in a transverse excursion in the negative Z-direction. The expansion in the Y-direction of foil 7 will also result in an excursion in the negative Z-direction.

Both excursions are accompanied by distortions whose even harmonics oppose each other and substantially cancel each other. The resultant reproduced signal is then virtually undistorted.

FIG. 7 schematically shows a loudspeaker diaphragm in accordance with the invention in which the diaphragm 20 is freely supported by an annular frame. Said diaphragm 20 comprises a foil which has at least a preferred direction in the X and Y-"directions. So, for example, an isotropic piezoelectric foil can be used for the diaphragm 20".

During "tensioning" the diaphragm has been given a symmetrical saddle shape so that it is curved both in the X-direction and in the Y-direction.

The curvature is opposite in the two directions, i.e. the centers of curvature are disposed in the direction of the negative (X-Z plane) and the positive Z-axis (Y-Z plane) respectively, which can be seen in FIGS. 7*b* and 7*c* respectively, which are side views of said diaphragm with the frame in the X-direction and the Y-direction respectively.

The diaphragm 20 is provided with 4 electrodes on both sides (shown shaded in FIG. 7*a*) which constitute electrode pairs 21 and 22 respectively that exhibit mirror symmetry relative to the X-and Y-direction.

The electrodes are connected to the output of an audio amplifier, not shown, in such a way that an expansion of the foil in the X-direction owing to a signal on the electrodes 22 is attended by a simultaneous contraction in the Y-direction owing to a signal on the electrodes 21. If the entire foil, for example, exhibits one direction of polarization perpendicular to the surface, then electrode pair 21 is connected to the audio amplifier with a polarity opposite to that of the electrode pair 22, as indicated by the + and − signs in FIG. 7. It is alternatively possible to select the direction of polarization at the location of the one set of electrodes opposite to that at the location of the other set of electrodes, and to connect the audio amplifier to the electrodes with the same polarity.

If, owing to an electric field between the electrode pairs 21, the diaphragm is contracted in the X-direction, said diaphragm will move in the negative Z-direction.

Such a field which acts in the opposite direction between the electrode pairs 22 will cause the diaphragm to expand in the Y-direction, i.e. the diaphragm will also move in the negative Z-direction. Owing to the opposite curvatures the non-linear even harmonic distortions caused by each curvature oppose each other. In the case of a purely symmetrical electrode configuration the total distortion is substantially reduced and the non-linear distortion during sound reproduction is negligible.

A variant of a circular freely-mounted diaphragm with a different electrode configuration is shown in FIG. 8.

The diaphragm is provided with 8 electrodes on both sides, which electrodes have the shape of a sector of a circle. The 8 electrodes constitute 4 electrode pairs 25, 26, 27 and 28 which are alternately excited by audio signals of opposite polarity.

FIGS. 8*b* and 8*c* show side views. The operation is entirely analogous with that of FIG. 7.

Figures 9A, 9C:
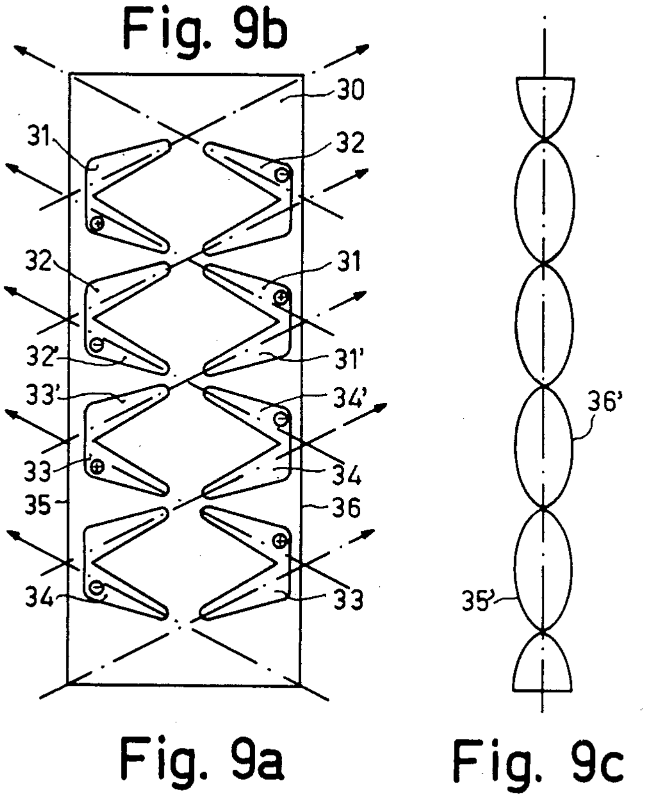

FIG. 9 shows a rectangular loudspeaker diaphragm which is at least piezo-electric in the dash-dot directions. The diaphragm is symmetrically undulated and oppositely curved in accordance with the dash-dot lines because it is tensioned in a frame 35, 36 whose left-hand part is curved in accordance with the curve 35' and whose right hand part is curved in accordance with the curve 36' in FIG. 9*c*. (On both sides the diaphragm is provided with electrode pairs 31, 32, 33 and 34, which are V-shaped, one limb of each electrode extending in the one dash-dot direction and another limb in the other dash-dot direction.

In respect of polarity the electrode pairs are oppositely connected to the output of an audio amplifier, as is indicated by the + and − signs. In fact each adjoining set of 4 electrodes, for example 31', 32', 33', 34', along with the foil constitutes an arrangement which is similar to that in accordance with FIG. 7*a*, the electrodes 31' and 33' corresponding to the electrodes 21 in FIG. 7*a* and the electrodes 32' and 34' to the electrodes 22 in FIG. 7*a*.

A loudspeaker diaphragm in accordance with FIG. 10 comprises a single piezoelectric polyvinylidene foil 40 which is secured in a rectangular frame 41. This foil need not be mounted freely in accordance with the known construction of FIG. 2. It may also be supported by a spongy base, as in the construction in accordance with FIG. 1, in which case care must be taken that the support is acoustically transparent.

The foil is piezo-electrically anisotropic with a preferred direction in the longitudinal direction X. The frame 41 comprises two confronting identical sides 42 and 43.

The sides 43 have been undulated, the left-hand part being oppositely identical to the right-hand part. Thus, the diaphragm 40 obtains an undulated appearance.

The diaphragm is provided with electrodes on both sides, which electrodes are interrupted over the full width in the center at the location of the point of curvature 44.

The left-hand electrode is connected to the output of an audio amplifier with a polarity opposite to that of the right-hand electrode. Alternatively the amplifier may be connected with the same polarity if the foil is locally oppositely polarized.

Owing to the opposite curvature of the two parts of the diaphragm the surface of said diaphargm moves bodily upwards or downwards.

Expansion of the left part causes the diaphragm to move upwards. This transverse movement is attended by distortion. Simultaneously the right part of the diaphragm contracts, which also results in an upward movement, but now with an even harmonic distortion of opposite sign.

In total the diaphragm moves upwards, the volume displacement in the surrounding air corresponding to the applied signal substantially without distortion.

A variant of the above-mentioned curved frame is schematically shown in FIG. 11.

The frame in this case comprises separate sections 51, 52, 53, 54, 55, which are arranged adjacent each other in the Z-direction perpendicular to the diaphragm surface and in frames with curved limbs, similar to for example the half frame with the limbs 41 in FIG. 10. The direction of overstretching (i.e. the preferred piezo-electrical direction) is for example again the X-direction and the polarity of the applied voltage changes alternately, as is indicated by the + and − signs.

As a result of this the part 51 will for example move to the right and the part 52 to the left at the same time, the part 53 in its turn to the right and 54 to the left.

Thus, the air in the chambers between the parts 51 and 52 and between the parts 53 and 54 will be forced upwards and simultaneously be drawn between the parts 52 and 53 and between 54 and 55 respectively, and result in a radiation of acoustic power in the X-direction. However, the volume change of these chambers is exempt from even harmonics of the diaphragm excursions so that consequently even harmonic distortion in the radiated acoustic power is compensated for.

What is claimed is:

1. An electro-acoustic device comprising a diaphragm which includes at least one foil of a piezoelectric polymer material, at least one pair of electrodes located on opposite sides of said foil so that electric signals on said electrodes are converted into acoustic vibrations and vice versa, the diaphragm being maintained in a curved position under mechanical prestress in the rest conditon such that for every point on the diaphragm surface a first and a second tangential direction can be found, in which the curvatures of the surface are opposite to one another, the curved shape of the diaphragm and the location of the electrodes being arranged so that changes in surface shape in response to said electric signals and the corresponding non-linear conversion into acoustic vibrations of given portions of the diaphragm is combined with similar changes in surface shape of other portions of the diaphragm so that the conversion into acoustic vibrations of the given and other portions for the fundamental wave of the signals augment one another but said given and other portions of the diaphragm provide a compensating effect for the even harmonics of the signals.

2. An electro-acoustic device comprising a diaphragm which includes two foils of anisotropic piezoelectric polymer material superimposed over each other over the major part of the surface area and with their preferred directions extending at an orthogonal angle relative to each other, at least one pair of electrodes located on respective surfaces of said two foils so that electric signals applied to said electrodes are converted into acoustic vibrations and vice versa, the diaphragm being maintained in a curved position in a rest condition in which the surface is curved in more than one direction under a mechanical prestress, the curved shape of the diaphragm in the rest condition and the location of the electrodes being such that changes in surface shape in response to the electric signals and the corresponding non-linear conversion into acoustic vibrations of given portions of the diaphragm is combined with similar changes in surface shape of other portions of the diaphragm so that the conversion into acoustic vibrations of the given and other portions for the fundamental wave of the signals augment one another but said given and other portions of the diaphragm provide a compensating effect for the even harmonics of the signals.

3. A device as claimed in claim 2 wherein the two foils are oppositely polarized in directions perpendicular to the foil surfaces.

4. An electro-acoustic converting device comprising a diaphragm secured to a chassis which in a rest condition maintains the diaphragm in a curved position with the diaphragm main surfaces curved in more than one direction, and a pair of electrodes provided at the main surfaces of the diaphragm, wherein the diaphragm comprises two foils of anisotropic piezoelectric material attached to each other via a main surface area and each of which foils have an individual preferred direction, the preferred directions of said two foils extending at an angle to each other in two directions in which the diaphragm is oppositely curved in the rest position, said two foils being polarized in directions such that an electric signal applied to the electrodes causes all points of the diphragm to vibrate in phase for the fundamental frequency of the electrical signal.

5. An electro-acoustic device as claimed in claim 4 wherein the two foils are polarized in opposite directions and perpendicular to their main surfaces and the electrodes are located opposite to each other on opposite main surfaces of the diaphragm and are adapted to be coupled to different electric terminals of an electric terminal pair.

6. An electro-acoustic converting device as claimed in claim 4 wherein the two foils are polarized in the same direction perpendicular to their main surfaces, the electrodes being located opposite to each other on opposite main surfaces of the diaphragm and adapted to be coupled to a first terminal of an electric terminal pair, and said device further comprises a further electrode arranged between the two foils and adapted to be coupled to a second terminal of the electric terminal pair.

7. An electro-acoustic converting device comprising a diaphragm of a piezoelectric polymer material secured to a chasis which in a rest condition maintains the diaphragm in a curved position with the diaphragm surfaces curved in more than one direction, the diaphragm having at least two preferred directions extending at an angle to each other in two directions in which the diaphragm is oppositely curved in the rest condition, at least four electrode pairs located on the diaphragm with two electrodes of each pair positioned opposite to each other on opposite main surfaces of the diaphragm and adapted to be coupled to different terminals of an electric terminal pair, the electrodes on each of the main surfaces of the diaphragm being positioned in pairs located symmetrically with respect to the center of said main surface and wherein the two electrodes of each symmetrical pair are adapted to be coupled to the same terminal of the electric terminal pair, and wherein equal numbers of electrodes on the same diaphragm surface are adapted to be coupled to each of said terminals of the electric terminal pair.

8. An electro-acoustic device as claimed in claim 7 wherein the diaphragm comprises one foil of an isotropic piezoelectric polymer material having a direction of polarization perpendicular to its surface.

9. An electro-acoustic device as claimed in claim 7 wherein the diaphragm comprises two foils of anisotropic piezoelectric polymer material each having an individual preferred direction, the directions of polarization of both foils being in the same direction and perpendicular to the surface of the diaphragm.

10. An electro-acoustic device as claimed in claims 7, 8 or 9 wherein the electrodes are V-shaped with each leg of the V lying in one of the two preferred directions.

11. An electro-acoustic device as claimed in claim 4 wherein the chassis maintains the diaphragm in said curved position in the rest condition under a mechanical prestress.

* * * * *